(12) United States Patent
Yang et al.

(10) Patent No.: US 12,100,441 B2
(45) Date of Patent: *Sep. 24, 2024

(54) READOUT CIRCUIT LAYOUT AND SENSE AMPLIFICATION CIRCUIT

(71) Applicant: CHANGXIN MEMORY TECHNOLOGIES, INC., Hefei (CN)

(72) Inventors: Guifen Yang, Hefei (CN); Sungsoo Chi, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 250 days.

This patent is subject to a terminal disclaimer.

(21) Appl. No.: 17/836,296

(22) Filed: Jun. 9, 2022

(65) Prior Publication Data

US 2023/0230630 A1 Jul. 20, 2023

Related U.S. Application Data

(63) Continuation of application No. PCT/CN2022/081731, filed on Mar. 18, 2022.

(30) Foreign Application Priority Data

Jan. 14, 2022 (CN) .......................... 202210044918.0

(51) Int. Cl.
G11C 7/06 (2006.01)
G11C 11/4091 (2006.01)
H10B 12/00 (2023.01)

(52) U.S. Cl.
CPC .......... G11C 11/4091 (2013.01); H10B 12/50 (2023.02); G11C 7/06 (2013.01); G11C 2207/002 (2013.01)

(58) Field of Classification Search
CPC . G11C 11/4091; G11C 7/06; G11C 2207/002; H10B 12/50
See application file for complete search history.

(56) References Cited

U.S. PATENT DOCUMENTS 10,224,093 B2 3/2019 Kim
11,581,034 B1 * 2/2023 Chi ..................... G11C 11/4097
(Continued)

FOREIGN PATENT DOCUMENTS

EP 3920185 A1 * 12/2021 ......... G11C 11/4091

*Primary Examiner* — Mushfique Siddique
(74) *Attorney, Agent, or Firm* — Kilpatrick Townsend & Stockton LLP

(57) ABSTRACT

A readout circuit architecture and a sense amplification circuit are provided. The readout circuit architecture includes: a readout amplification unit including a first P-type transistor and a second P-type transistor; and a first offset compensation unit including a first offset compensation transistor and a second offset compensation transistor. The first P-type transistor is arranged in a first area and the second P-type transistor is arranged in a second area. When the first area and the second area are arranged at interval in a first direction, the first offset compensation transistor and the second offset compensation transistor are arranged in a third area located between the first area and the second area. When the first area and the second area are arranged adjacently in the first direction, the first offset compensation transistor is arranged in a fourth area and the second offset compensation transistor is arranged in a fifth area.

15 Claims, 12 Drawing Sheets

(56) References Cited

U.S. PATENT DOCUMENTS

| | | | |
|---|---|---|---|
| 11,594,264 B1* | 2/2023 | Chi | G11C 11/4094 |
| 2018/0061461 A1* | 3/2018 | Seo | G11C 7/18 |
| 2019/0007000 A1* | 1/2019 | Jeong | G11C 11/4096 |
| 2022/0068357 A1* | 3/2022 | Lin | G11C 11/4074 |
| 2022/0208235 A1* | 6/2022 | Peng | G11C 7/02 |
| 2022/0383940 A1* | 12/2022 | Yang | H10B 12/50 |
| 2023/0223074 A1* | 7/2023 | Yang | G11C 11/4097 365/63 |

\* cited by examiner

READOUT CIRCUIT LAYOUT AND SENSE AMPLIFICATION CIRCUIT

CROSS-REFERENCE TO RELATED APPLICATION

The disclosure is a continuation of International Application No. PCT/CN2022/081731, filed on Mar. 18, 2022, which is based upon and claims priority to Chinese patent application No. 202210044918.0, filed on Jan. 14, 2022. The contents of International Application No. PCT/CN2022/081731 and Chinese patent application No. 202210044918.0 are hereby incorporated by reference in their entireties.

BACKGROUND

A Dynamic Random Access Memory (DRAM) is a common semiconductor memory device in the computers and is composed of many memory cells. Each memory cell usually includes a capacitor and a transistor. A gate of the transistor is connected to a word line, a drain of the transistor is connected to a bit line, and a source of the transistor is connected to the capacitor. A voltage signal on the word line can control the transistor to be turned on or turned off, and then data information stored in the capacitor is read through the bit line, or the data information is written into the capacitor through the bit line for storage.

A sense amplifier is an important part of the DRAM, and plays a key role in reading and writing the data information. However, a Positive channel Metal Oxide Semiconductor (PMOS) offset exists in the sense amplifier, which causes a level fluctuation of the bit line level during the data reading and writing, thereby interfering with normal data reading and writing operations. Moreover, the sense amplifier includes multiple transistors and in this case, there is the problem of unreasonable layout.

SUMMARY

Embodiments of the disclosure relate to the field of semiconductor technologies, and provide a readout circuit architecture and a sense amplification circuit.

In a first aspect, the embodiments of the disclosure provide a readout circuit architecture, which includes a sense amplifier. The sense amplifier includes a readout amplification circuit and a first offset compensation circuit.

The readout amplification circuit is configured to amplify a target voltage on a readout bit line and a complementary readout bit line. The readout amplification circuit includes a first P-type transistor and a second P-type transistor.

The first offset compensation circuit is configured to connect a control terminal of the first P-type transistor and a control terminal of the second P-type transistor to a preset voltage in response to an offset cancelling signal. The first offset compensation circuit includes a first offset compensation transistor and a second offset compensation transistor.

The first P-type transistor is arranged in a first area, and the second P-type transistor is arranged in a second area.

When the first area and the second area are arranged at interval in a first direction, both the first offset compensation transistor and the second offset compensation transistor are arranged in a third area which is located between the first area and the second area.

When the first area and the second area are arranged adjacently in the first direction, the first offset compensation transistor is arranged in a fourth area which is arranged on a side, away from the second area, of the first area, and the second offset compensation transistor is arranged in a fifth area which is arranged on a side, away from the first area, of the second area.

In a second aspect, the embodiments of the disclosure provide a sense amplification circuit, which includes: a readout amplification circuit, an isolation circuit, a first offset compensation circuit and a second offset compensation circuit.

The readout amplification circuit is configured to amplify a target voltage on a readout bit line and a complementary readout bit line. The readout amplification circuit include a P-type transistor and a N-type transistor.

The isolation circuit is configured to connect a bit line to the complementary readout bit line and connect a complementary bit line to the readout bit line in response to an isolation signal, and connect a control terminal of the P-type transistor to the readout bit line or the complementary readout bit line in response to the isolation signal.

The first offset compensation circuit is configured to connect the control terminal of the P-type transistor to a preset voltage in response to an offset cancelling signal.

The second offset compensation circuit is configured to connect the bit line to the readout bit line and connect the complementary bit line to the complementary readout bit line in response to the offset cancelling signal.

DETAILED DESCRIPTION

For making the objectives, technical solutions and advantages of the disclosure clearer, the technical solutions of the disclosure will further be elaborated below in combination with the drawings and embodiments in detail. The described embodiments should not be considered as limiting the disclosure. All other embodiments obtained by those of ordinary skill in the art without creative work shall fall within the scope of protection of the disclosure.

"Some embodiments" involved in the following descriptions describes a subset of all possible embodiments. However, it should be understood that "some embodiments" may be the same subset or different subsets of all the possible embodiments, and may be combined without conflicts.

If the "first/second" and similar descriptions appear in the present disclosure, the following explanation will be added. In the following descriptions, the term "first/second/third" involved is only for distinguishing similar objects and does not represent a specific sequence of the objects. It should be understood that "first/second/third" may be interchanged in a specific sequence or order where permitted, to enable the embodiments of the disclosure described herein to be implemented in orders except the illustrated or described ones.

Unless otherwise defined, all technical and scientific terms used herein have the same meaning as commonly understood by those skilled in the art to which the disclosure belongs. Terms used in the disclosure are only used for describing the purpose of the embodiments of the disclosure, but not intended to limit the disclosure.

In the following embodiments or examples, the terms "unit" and "subunit" and the like in a readout circuit architecture or a sense amplification circuit may be implemented by one or more hardware circuits and/or one or more processors. In some examples, a unit or subunit may include one or more circuits with or without stored code or instructions. The unit or subunit may include one or more components that are directly or indirectly connected. These components may or may not be physically attached to, or located adjacent to, one another.

In a DRAM, data stored in a memory cell (or main cell) needs to be read out by a sense amplifier. However, the sense amplifier will generate an offset during data reading, which affects the accuracy of readout results.

Figure 1:
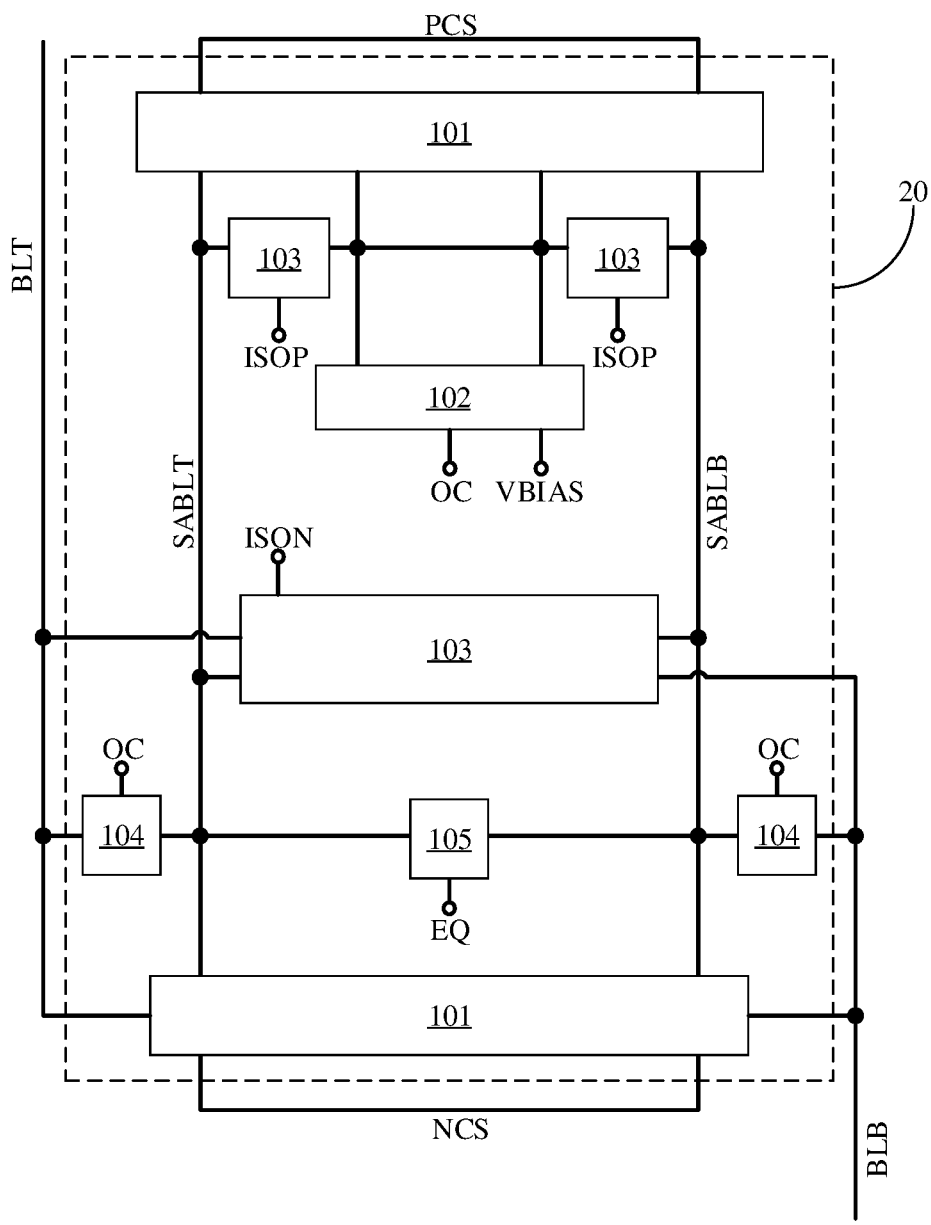
FIG. 1 is a first structure diagram of a readout circuit architecture provided by an embodiment of the disclosure.
Figure 2:
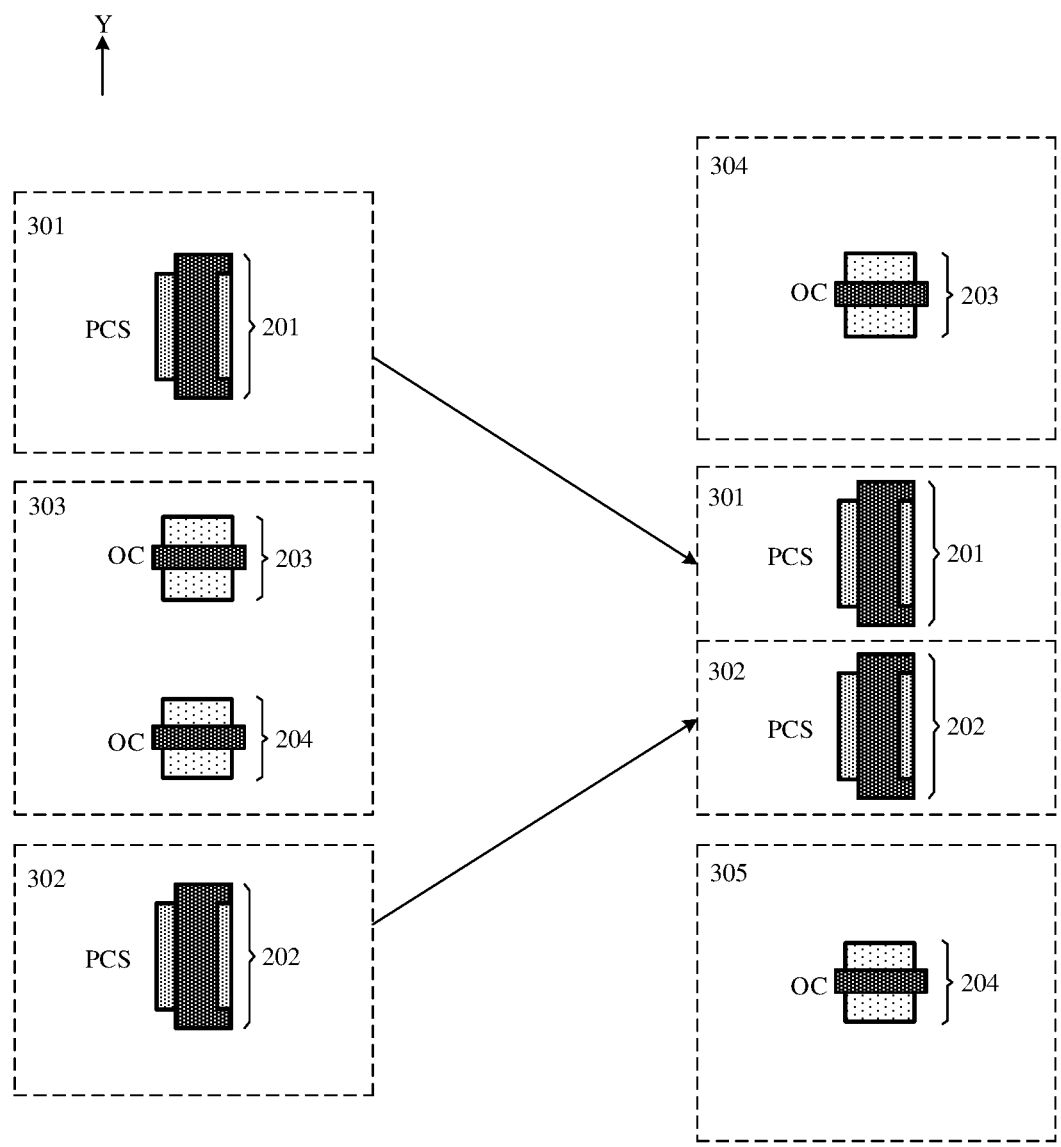
FIG. 2 is a second structure diagram of a readout circuit architecture provided by an embodiment of the disclosure.

FIG. 1 and FIG. 2 are optional structure diagrams of a readout circuit architecture provided by the embodiments of the disclosure.

As shown in FIG. 1, the readout circuit architecture 10 includes a sense amplifier 20. The sense amplifier 20 includes a readout amplification unit 101 and a first offset compensation unit 102. The readout amplification unit 101 is configured to amplify a target voltage on a readout bit line SABLT and a complementary readout bit line SABLB. The readout amplification unit 101 includes a first P-type transistor and a second P-type transistor. The first offset compensation unit 102 is configured to connect a control terminal of the first P-type transistor and a control terminal of the second P-type transistor to a preset voltage VBIAS in response to an offset cancelling OC signal. The first offset compensation unit 102 includes a first offset compensation transistor and a second offset compensation transistor.

As shown in FIG. 2, the first P-type transistor 201 is arranged in a first area 301, and the second P-type transistor 202 is arranged in a second area 302. When the first area 301 and the second area 302 are arranged at interval in a first direction Y, both the first offset compensation transistor 203 and the second offset compensation transistor 204 are arranged in a third area 303 which is located between the first area 301 and the second area 302. When the first area 301 and the second area 302 are arranged adjacently in the first direction Y, the first offset compensation transistor 203 is arranged in a fourth area 304 which is arranged on a side, away from the second area 302, of the first area 301; and the second offset compensation transistor 204 is arranged in a fifth area 305 which is arranged on a side, away from the first area 301, of the second area 302.

It should be noted that FIG. 2 illustrates the pattern of each of the transistors in the layout. The transistor consists of an active area and a gate electrode on the active area. The layout of the transistors needs to be designed. A good layout design can shorten the wiring length, improve the level of integration, and thus improve the overall performance.

In the embodiments of the disclosure, the first P-type transistor 201 is arranged in the first area 301, and the second P-type transistor 202 is arranged in the second area 302. The first area 301 and the second area 302 may be arranged at interval or adjacently. When the first area 301 and the second area 302 are arranged at interval in the first direction Y, both the first offset compensation transistor 203 and the second offset compensation transistor 204 may be arranged in the third area 303 between the first area 301 and the second area 302, as shown in the left side of FIG. 2. When the first area 301 and the second area 302 are arranged adjacently in the first direction Y, the first offset compensation transistor 203 may be arranged in the fourth area 304 which is arranged on the side, away from the second area 302, of the first area 301; and the second offset compensation transistor 204 may be arranged in the fifth area 305 which is arranged on the side, away from the first area 301, of the second area 302, as shown in the right side of FIG. 2.

It should be understood that the readout circuit architecture provided by the embodiments of the disclosure includes a variety of transistor layout designs, which can adapt to a variety of design requirements and help determine the optimal layout design, thereby shortening the wiring length, improving the level of integration, and improving the overall performance.

In some embodiments of the disclosure, the readout amplification unit 101 further includes a first N-type transistor and a second N-type transistor.

Figure 3:
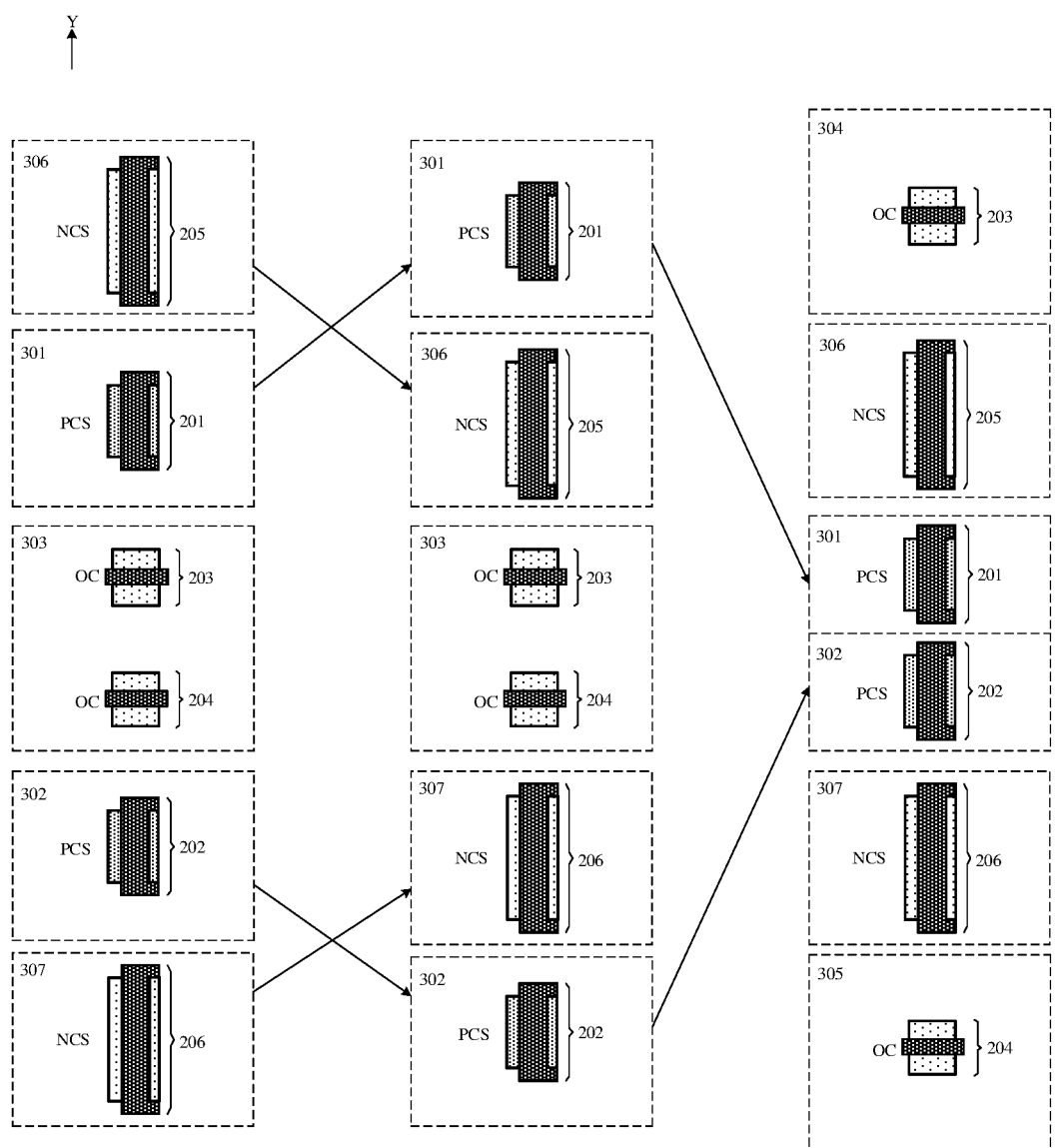
FIG. 3 is a third structure diagram of a readout circuit architecture provided by an embodiment of the disclosure.

As shown in FIG. 3, the first N-type transistor 205 is arranged in a sixth area 306, the second N-type transistor 206 is arranged in a seventh area 307, and the sixth area 306 and the seventh area 307 are arranged in the first direction Y. The sixth area 306 is adjacent to the first area 301, the seventh area 307 is adjacent to the second area 302, and both the sixth area 306 and the seventh area 307 are located between or outside the first area 301 and the second area 302. When the first area 301 and the second area 302 are arranged at interval in the first direction Y, the sixth area 306, the first area 301, the third area 303, the second area 302 and the seventh area 307 are arranged in sequence in the first direction Y, or the first area 301, the sixth area 306, the third area 303, the seventh area 307 and the second area 302 are arranged in sequence in the first direction Y. When the first area 301 and the second area 302 are arranged adjacently in the first direction Y, the sixth area 306 is located between the first area 301 and the fourth area 304, and the seventh area 307 is located between the second area 302 and the fifth area 305.

In the embodiments of the disclosure, the first N-type transistor 205 is arranged in the sixth area 306, and the second N-type transistor 206 is arranged in the seventh area 307. The sixth area 306 and the seventh area 307 are arranged in the first direction Y, that is, the first area 301, the second area 302, the sixth area 306 and the seventh area 307 are arranged in the same direction. The sixth area 306 is adjacent to the first area 301, and the seventh area 307 is adjacent to the second area 302. Both the sixth area 306 and the seventh area 307 may be arranged between or outside the first area 301 and the second area 302.

When the first area 301 and the second area 302 are arranged at interval in the first direction Y, the sixth area 306, the first area 301, the third area 303, the second area 302 and the seventh area 307 are arranged in sequence in the first direction Y, as shown in the left side of FIG. 3; or the first area 301, the sixth area 306, the third area 303, the seventh area 307 and the second area 302 are arranged in sequence in the first direction Y, as shown in the middle of FIG. 3. When the first area 301 and the second area 302 are arranged adjacently in the first direction Y, the sixth area 306 is located between the first area 301 and the fourth area 304, and the seventh area 307 is located between the second area 302 and the fifth area 305, as shown in the right side of FIG. 3.

It should be understood that the readout circuit architecture provided by the embodiments of the disclosure implements a variety of layout designs for the first N-type transistor, the second N-type transistor, the first P-type transistor, the second P-type transistor, the first offset compensation transistor and the second offset compensation transistor, so as to shorten the wiring length of the first N-type transistor, the second N-type transistor, the first P-type transistor, the second P-type transistor.

In some embodiments of the disclosure, as shown in FIG. 1, the sense amplifier 20 further includes an isolation unit 103, a second offset compensation unit 104 and an equalizing unit 105. The isolation unit 103 is configured to: in response to an isolation signal ISOP or ISON, connect a bit line BLT to the complementary readout bit line SABLB and connect a complementary bit line BLB to the readout bit line SABLT, and connect the control terminal of the first P-type transistor to the complementary readout bit line SABLB and connect the control terminal of the second P-type transistor to the readout bit line SABLT. The isolation unit 103 includes a first isolation transistor, a second isolation transistor, a third isolation transistor and a fourth isolation transistor. The second offset compensation unit 104 is configured to connect the bit line BLT to the readout bit line SABLT and connect the complementary bit line BLB to the complementary readout bit line SABLB in response to the offset cancelling OC signal. The second offset compensation unit 104 includes a third offset compensation transistor and a fourth offset compensation transistor. The equalizing unit 105 is configured to equalize voltages of the readout bit line SABLT and the complementary readout bit line SABLB. The equalizing unit 105 includes an equalizing transistor.

Figure 4:
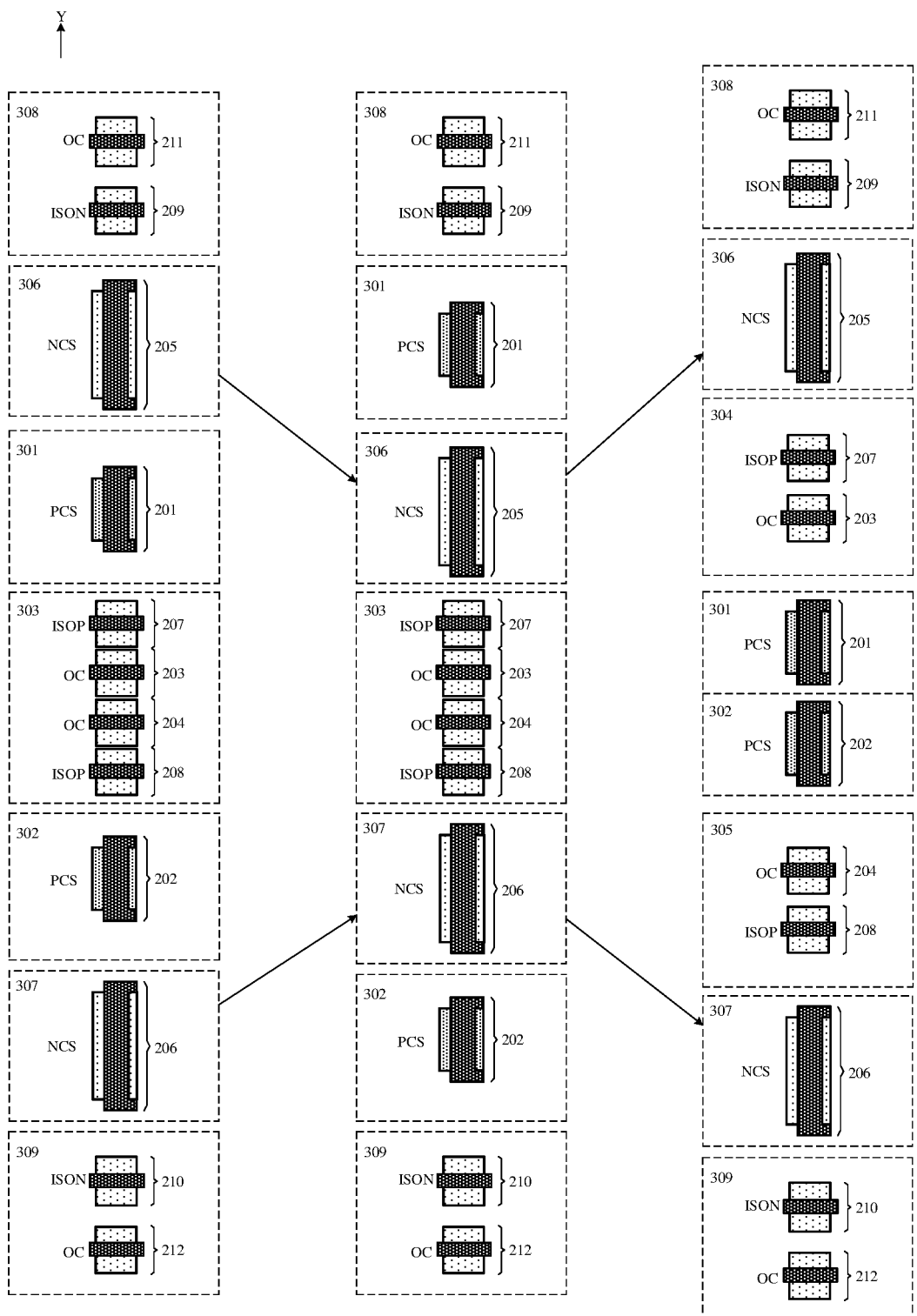
FIG. 4 is a fourth structure diagram of a readout circuit architecture provided by an embodiment of the disclosure.

As shown in FIG. 4, both the third isolation transistor 209 and the third offset compensation transistor 211 are arranged in an eighth area 308, both the fourth isolation transistor 210 and the fourth offset compensation transistor 212 are arranged in a ninth area 309. The eighth area 308 and the ninth area 309 are arranged outside the first area 301 and the second area 302 in the first direction Y, and are located on different sides of the first area 301 and the second area 302. When the first area 301 and the second area 302 are arranged at interval in the first direction Y, both the first isolation transistor 207 and the second isolation transistor 208 are arranged in the third area 303. When the first area 301 and the second area 302 are arranged adjacently in the first direction Y, the first isolation transistor 207 is arranged in the fourth area 304, and the second isolation transistor 208 is arranged in the fifth area 305. In the above layout, the equalizing transistor may be arranged in one of the third area 303, the fourth area 304, the fifth area 305, the eighth area 308 and the ninth area 309.

Figure 5:
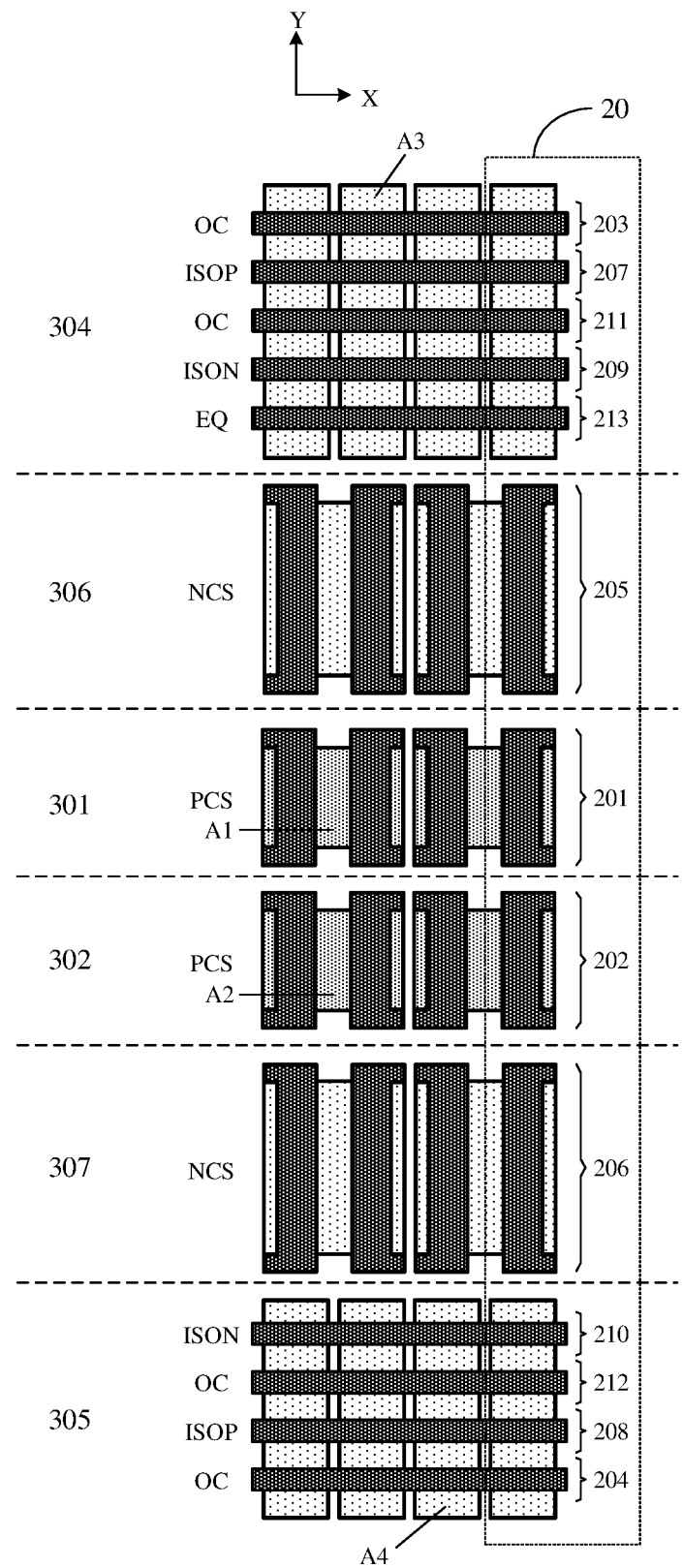
FIG. 5 is a fifth structure diagram of a readout circuit architecture provided by an embodiment of the disclosure.
Figure 6:
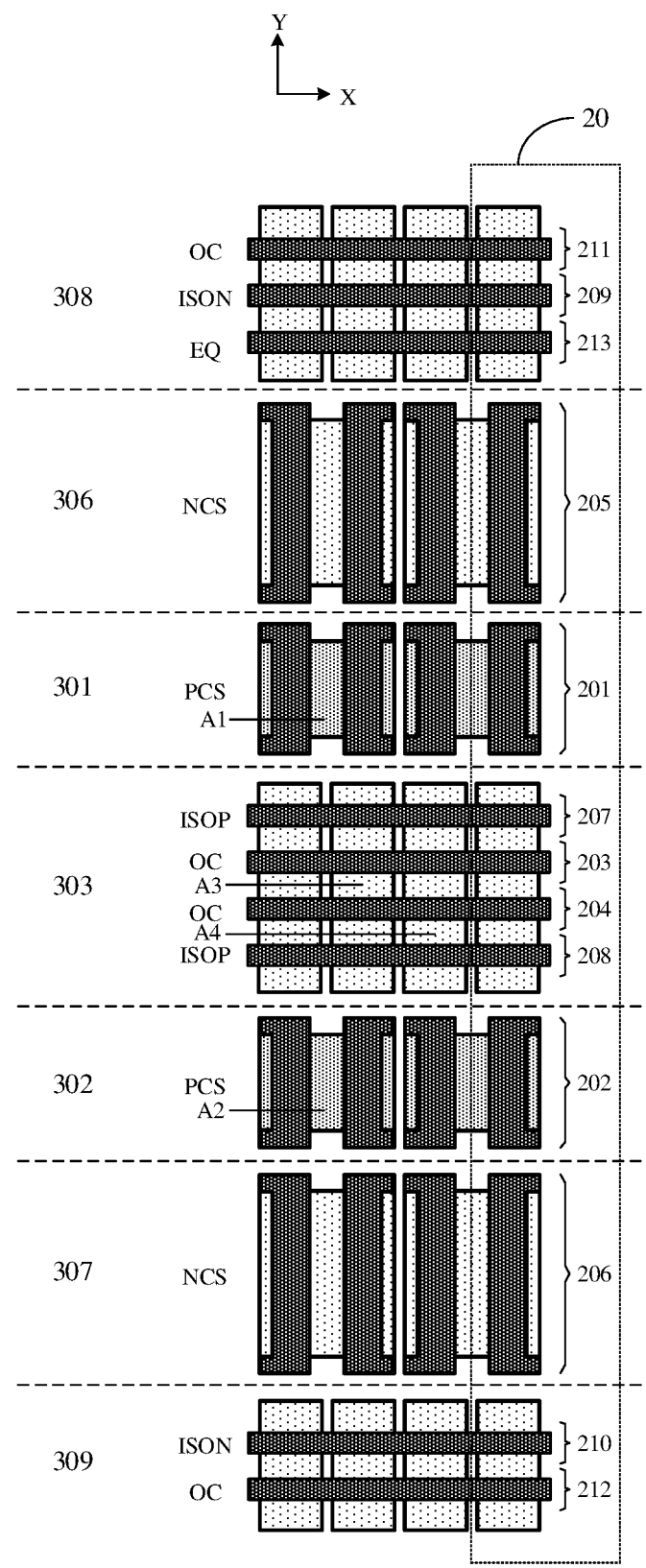
FIG. 6 is a sixth structure diagram of a readout circuit architecture provided by an embodiment of the disclosure.

In the embodiments of the disclosure, both the third isolation transistor 209 and the third offset compensation transistor 211 are arranged in the eighth area 308, and both the fourth isolation transistor 210 and the fourth offset compensation transistor 212 are arranged in the ninth area 309. The eighth area 308, the ninth area 309 and other areas are arranged in the same direction (i.e., the first direction Y). The eighth area 308 and the ninth area 309 are arranged outside the first area 301 and the second area 302, and are arranged on different sides of the first area 301 and the second area 302. When the first area 301 and the second area 302 are arranged at interval in the first direction Y, both the first isolation transistor 207 and the second isolation transistor 208 are arranged in the third area 303, as shown in the left side and middle of FIG. 4. When the first area 301 and the second area 302 are arranged adjacently in the first direction Y, the first isolation transistor 207 is arranged in the fourth area 304, and the second isolation transistor 208 is arranged in the fifth area 305, as shown in the right side of FIG. 4. The equalizing transistor may be arranged in any one of the third area 303, the fourth area 304, the fifth area 305, the eighth area 308 and the ninth area 309. In some embodiments of the disclosure, as shown in FIG. 5 and FIG. 6, there are multiple groups of sense amplifiers 20. The multiple groups of sense amplifiers 20 are arranged separately in a second direction X. The second direction X is perpendicular to the first direction Y. The first P-type transistors 201 of two adjacent groups of sense amplifiers 20 share the same first active area A1. The first active area A1 is arranged in the first area 301. The first area 301 further includes two first P-type transistor 201 gates arranged above the first active area A1 and arranged in the second direction X. The first P-type transistor 201 gates cover the first active area A1 in the first direction Y by a width of the first active area A1. The second P-type transistors 202 of two adjacent groups of sense amplifiers 20 share the same second active area A2. The second active area A2 is arranged in the second area 302. The second area 302 further includes two second P-type transistor 202 gates arranged above the second active area A2 and arranged in the second direction X.

It should be noted that that two transistors share the same active area, which represents that connection terminals of the two transistors corresponding to the same active area are shared or are connected to the same node, For example, two sources or drains are shared or are connected to the same constant voltage source or ground.

In the embodiments of the disclosure, the first offset compensation transistors 203 of the multiple groups of sense amplifiers 20 correspond to multiple third active areas A3. The multiple third active areas A3 are arranged separately in the second direction and are arranged in the third area 303 or the fourth area 304. If the first offset compensation transistors 203 are arranged in the third area 303, the multiple third active areas A3 are arranged in the third area 303, as shown in FIG. 6. If the first offset compensation transistors 203 are arranged in the fourth area 304, the multiple third active areas A3 are arranged in the fourth area 304, as shown in FIG. 5. The third area 303 or the fourth area 304 further includes one first offset compensation transistor 203 gate extending in the second direction X. The one first offset compensation transistor 203 gate covers the multiple third active areas A3.

The second offset compensation transistors 204 of the multiple groups of sense amplifiers 20 correspond to multiple fourth active areas A4. The multiple fourth active areas A4 are arranged separately in the second direction X and are arranged in the third area 303 or the fifth area 305. If the second offset compensation transistors 204 are arranged in the third area 303, the multiple fourth active areas A4 are arranged in the third area 303, as shown in FIG. 6. If the second offset compensation transistors 204 are arranged in the fifth area 305, the multiple fourth active areas A4 are arranged in the fifth area 305, as shown in FIG. 5. The third area 303 or the fifth area 305 further includes one second offset compensation transistor 204 gate extending in the second direction X. The one second offset compensation transistor 204 gate covers the multiple fourth active areas A4.

In the embodiments of the disclosure, if both the first offset compensation transistor 203 and the second offset compensation transistor 204 are arranged in the third area 303, and the first offset compensation transistor 203 and the second offset compensation transistor 204 share the same common active area, then the third active areas A3 and the fourth active areas A4 overlap in the common active area, as shown in FIG. 6.

Figure 7:
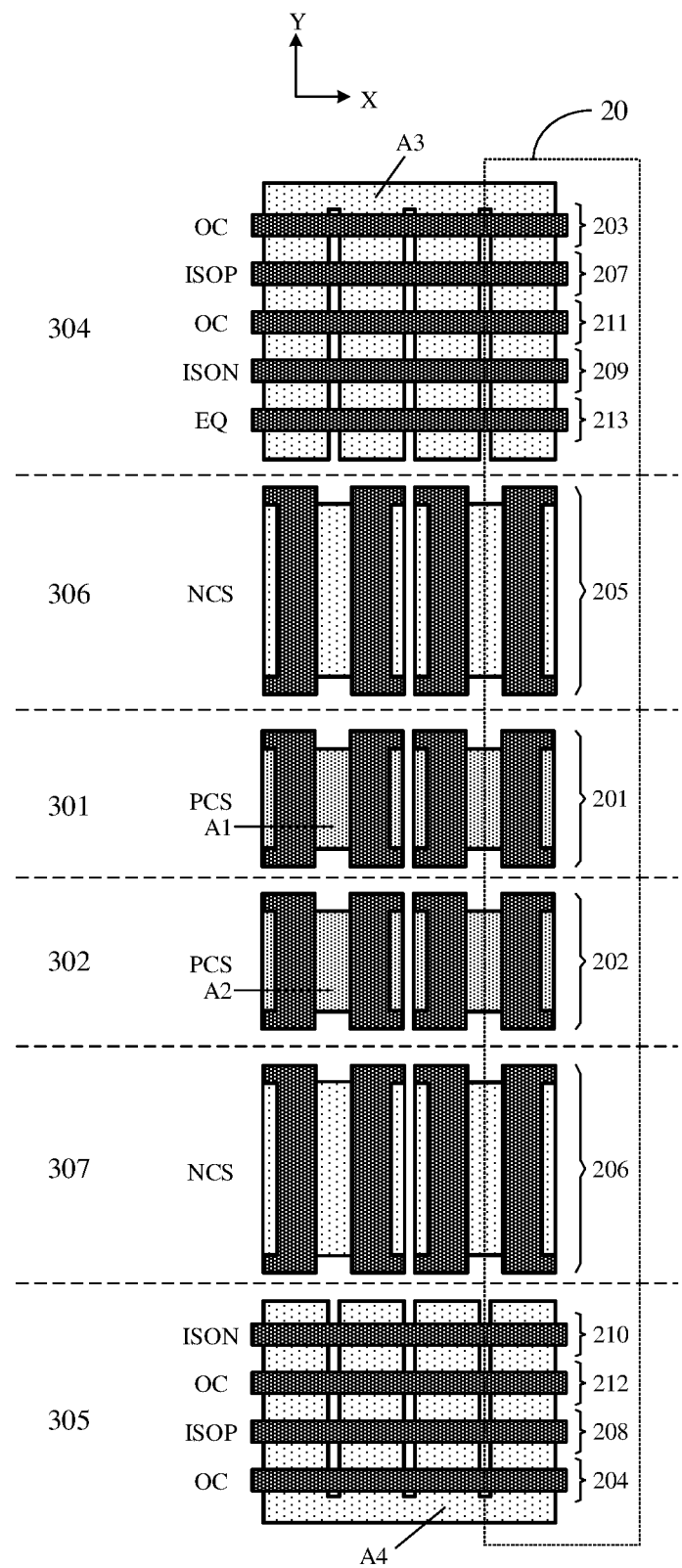
FIG. 7 is a seventh structure diagram of a readout circuit architecture provided by an embodiment of the disclosure.
Figure 8:
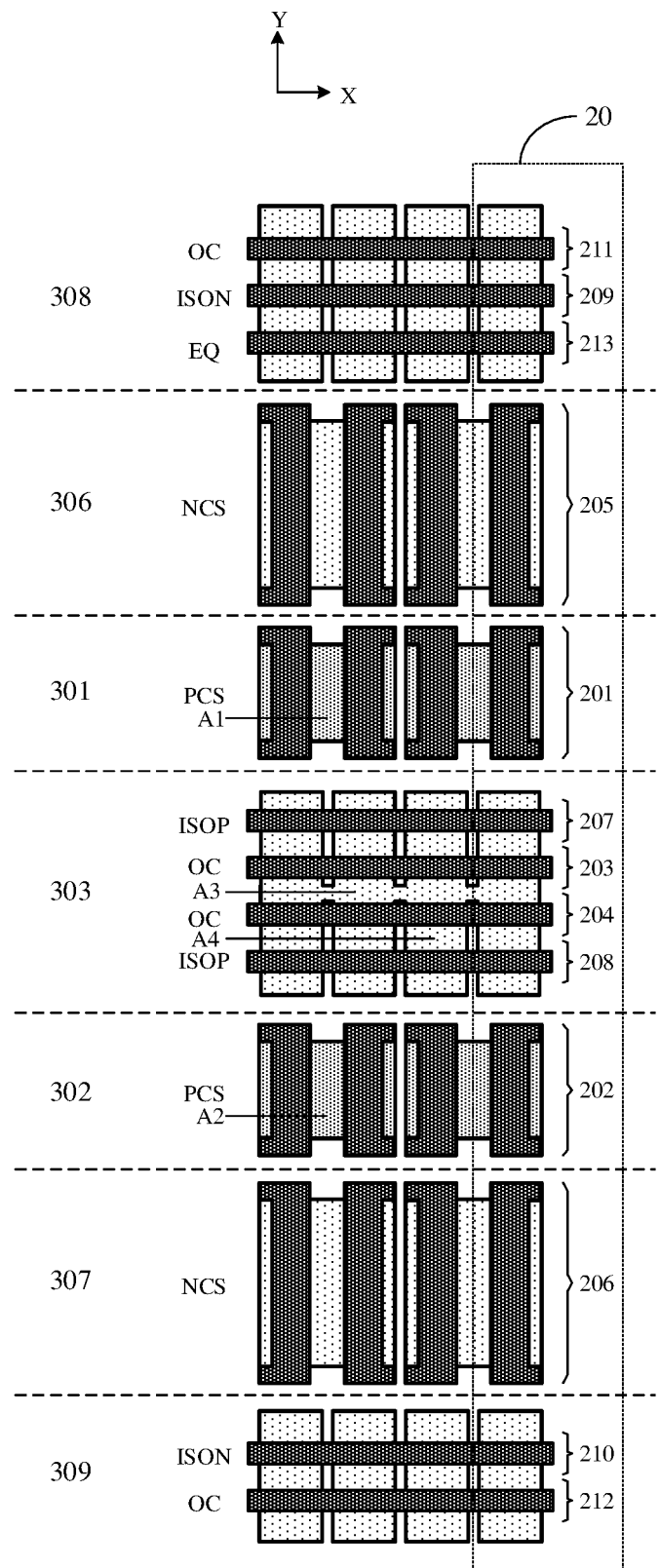
FIG. 8 is an eighth structure diagram of a readout circuit architecture provided by an embodiment of the disclosure.

In some embodiments of the disclosure, as shown in FIG. 7 and FIG. 8, the third active areas A3, where the sources or drains of the first offset compensation transistors 203 of the multiple groups of sense amplifiers 20 are located, are interconnected; and the fourth active areas A4, where the sources or drains of the second offset compensation transistors 204 of the multiple groups of sense amplifiers 20 are located, are interconnected.

In the embodiments of the disclosure, the first offset compensation transistor 203 and the second offset compensation transistor 204 are configured to connect the control terminal of the first P-type transistor and the control terminal of the second P-type transistor to the preset voltage in response to the offset cancelling signal. The source or drain of the first offset compensation transistor 203 and the source or drain of the second offset compensation transistor 204 are connected to the preset voltage VBIAS. Therefore, the sources or drains, connected to the preset voltage VBIAS, of the multiple first offset compensation transistors 203 and the multiple second offset compensation transistors 204 are interconnected, that is, the corresponding first offset compensation transistor 203 source or drain areas in the multiple third active areas A3 arranged in the second direction X are interconnected, and the corresponding second offset compensation transistor 204 source or drain areas in the multiple fourth active areas A4 are interconnected.

It should be understood that the transistors with the same type but with different functions share the same active area, by means of the setting of the shared source and drain terminals, use of metal wiring for connection is avoided and the occupied area is saved or reduced, thereby reducing the use of metal wiring, reducing the contact resistance, and improving the performance of the memory.

In some embodiments of the disclosure, both the first isolation transistor 207 and the second isolation transistor 208 are arranged in the third area 303, which includes that: the first isolation transistor 207, the first offset compensation transistor 203, the second offset compensation transistor 204 and the second isolation transistor 208 are arranged in sequential order in the first direction Y, as shown in FIG. 6 and FIG. 8; or the first offset compensation transistor 203, the first isolation transistor 207, the second isolation transistor 208 and the second offset compensation transistor 204 are arranged in sequential order in the first direction Y. The first isolation transistor 207, the first offset compensation transistor 203, the second offset compensation transistor 204 and the second isolation transistor 208 share the same active area. In some embodiments of the disclosure, as shown in FIG. 5 and FIG. 9, in the fourth area 304, the first offset compensation transistor 203 and the first isolation transistor 207 are arranged in sequential order or in reverse order in the first direction Y, and the first offset compensation transistor 203 and the first isolation transistor 207 share the same active area extending in the first direction Y; in the fifth area 305, the second isolation transistor 208 and the second offset compensation transistor 204 are arranged in sequential order or in reverse order in the first direction Y, and the second isolation transistor 208 and the second offset compensation transistor 204 share the same active area.

In some embodiments of the disclosure, as shown in FIG. 6, in the eighth area 308, the third offset compensation transistor 211 and the third isolation transistor 209 are arranged in sequential order or in reverse order in the first direction Y, and the third offset compensation transistor 211 and the third isolation transistor 209 share the same active area. In the ninth area 309, the fourth isolation transistor 210 and the fourth offset compensation transistor 212 are arranged in sequential order or in reverse order in the first direction Y, and the fourth isolation transistor 210 and the fourth offset compensation transistor 212 share the same active area.

Figure 9:
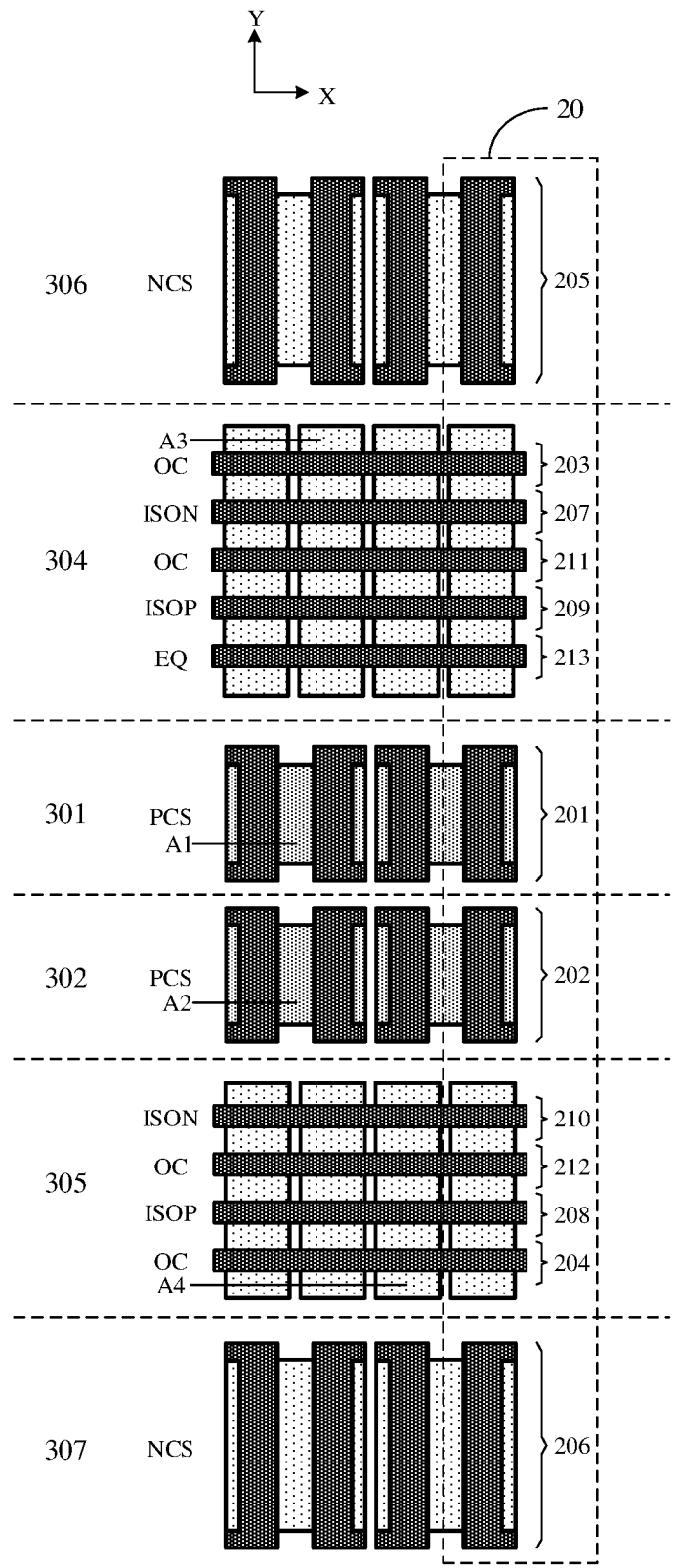
FIG. 9 is a ninth structure diagram of a readout circuit architecture provided by an embodiment of the disclosure.

In some embodiments of the disclosure, as shown in FIG. 5 and FIG. 9, the fourth area 304 is connected to the eighth area 308, that is, the eighth area 308 and the fourth area 304 are merged into one area and share the same active area. The eighth area 308 is not identified in the figure. The fifth area 305 is connected to the ninth area 309, that is, the ninth area 309 and the fifth area 305 are merged into one area. The ninth area 309 is not identified in the figure. In the fourth area 304 and eighth area 308 which are connected, the first offset compensation transistor 203, the first isolation transistor 207, the third offset compensation transistor 211 and the third isolation transistor 209 are arranged in sequential order or in reverse order in the first direction Y, and the first offset compensation transistor 203, the first isolation transistor 207, the third offset compensation transistor 211 and the third isolation transistor 209 share the same active area. In the fifth area 305 and ninth area 309 which are connected, the fourth isolation transistor 210, the fourth offset compensation transistor 212, the second isolation transistor 208 and the second offset compensation transistor 204 are arranged in sequential order or in reverse order in the first direction Y, and the fourth isolation transistor 210, the fourth offset compensation transistor 212, the second isolation transistor 208 and the second offset compensation transistor 204 share the same active area.

In combination with FIG. 5 to FIG. 9, in the first direction Y, the respective areas are arranged in one of the following orders.

(1) When the eighth area 308 is the same area as the fourth area 304, and the ninth area 309 is the same area as the fifth area 305, the fourth area 304, the sixth area 306, the first area 301, the second area 302, the seventh area 307 and the fifth area 305 are arranged in sequence.

In the fourth area 304, the first offset compensation transistor 203, the first isolation transistor 207, the third offset compensation transistor 211, the third isolation transistor 209 and the equalizing transistor 213 are arranged in sequence.

For multiple first offset compensation transistors 203 arranged in the second direction X, the active areas where the sources or drains of the multiple first offset compensation transistors 203 are located are interconnected.

In the fifth area 305, the fourth isolation transistor 210, the fourth offset compensation transistor 212, the second isolation transistor 208 and the second offset compensation transistor 204 are arranged in sequence.

For multiple fourth offset compensation transistors 212 arranged in the second direction X, the active areas where the sources or drains of the multiple fourth offset compensation transistors 212 are located are interconnected or are not interconnected.

(2) When the eighth area 308 is the same area as the fourth area 304, and the ninth area 309 is the same area as the fifth area 305, the sixth area 306, the fourth area 304, the first area 301, the second area 302, the fifth area 305 and the seventh area 307 are arranged in sequence.

In the fourth area 304, the first offset compensation transistor 203, the first isolation transistor 207, the third offset compensation transistor 211, the third isolation transistor 209 and the equalizing transistor 213 are arranged in sequence; and in the fifth area 305, the fourth isolation transistor 210, the fourth offset compensation transistor 212, the second isolation transistor 208 and the second offset compensation transistor 204 are arranged in sequence.

Or, in the fourth area 304, the equalizing transistor 213, the third isolation transistor 209, the third offset compensation transistor 211, the first isolation transistor 207 and the first offset compensation transistor 203 are arranged in sequence and share the same active area; and in the fifth area 305, the second offset compensation transistor 204, the second isolation transistor 208, the fourth offset compensation transistor 212 and the fourth isolation transistor 210 are arranged in sequence.

(3) The eighth area 308, the sixth area 306, the fourth area 304, the first area 301, the second area 302, the fifth area 305, the seventh area 307 and the ninth area 309 are arranged in sequence.

In the eighth area 308, the third offset compensation transistor 211, the third isolation transistor 209 and the equalizing transistor 213 are arranged in sequence;

in the fourth area 304, the first offset compensation transistor 203 and the first isolation transistor 207 are arranged in sequence;

in the fifth area 305, the second isolation transistor 208 and the second offset compensation transistor 204 are arranged in sequence; and in the ninth area 309, the fourth isolation transistor 210 and the fourth offset compensation transistor 212 are arranged in sequence.

Or, in the eighth area 308, the third isolation transistor 209, the third offset compensation transistor 211 and the equalizing transistor 213 are arranged in sequence;

in the fourth area 304, the first offset compensation transistor 203 and the first isolation transistor 207 are arranged in sequence;

in the fifth area 305, the second isolation transistor 208 and the second offset compensation transistor 204 are arranged in sequence; and in the ninth area 309, the fourth offset compensation transistor 212 and the fourth isolation transistor 210 are arranged in sequence.

Or, in the eighth area 308, the third isolation transistor 209, the third offset compensation transistor 211 and the equalizing transistor 213 are arranged in sequence;

in the fourth area 304, the first isolation transistor 207 and the first offset compensation transistor 203 are arranged in sequence;

in the fifth area 305, the second offset compensation transistor 204 and the second isolation transistor 208 are arranged in sequence; and in the ninth area 309, the fourth offset compensation transistor 212 and the fourth isolation transistor 210 are arranged in sequence.

Or, in the eighth area 308, the third offset compensation transistor 211 and the third isolation transistor 209 are arranged in sequence;

in the fourth area 304, the equalizing transistor 213, the first isolation transistor 207 and the first offset compensation transistor 203 are arranged in sequence;

in the fifth area 305, the second offset compensation transistor 204 and the second isolation transistor 208 are arranged in sequence; and in the ninth area 309, the fourth offset compensation transistor 212 and the fourth isolation transistor 210 are arranged in sequence.

Or, in the eighth area 308, the third offset compensation transistor 211 and the third isolation transistor 209 are arranged in sequence;

in the fourth area 304, the first isolation transistor 207, the first offset compensation transistor 203 and the equalizing transistor 213 are arranged in sequence;

in the fifth area 305, the second isolation transistor 208 and the second offset compensation transistor 204 are arranged in sequence; and in the ninth area 309, the fourth isolation transistor 210 and the fourth offset compensation transistor 212 are arranged in sequence.

Or, in the eighth area 308, the third isolation transistor 209 and the third offset compensation transistor 211 are arranged in sequence;

in the fourth area 304, the first offset compensation transistor 203, the first isolation transistor 207 and the equalizing transistor 213 are arranged in sequence;

in the fifth area 305, the second isolation transistor 208 and the second offset compensation transistor 204 are arranged in sequence; and in the ninth area 309, the fourth offset compensation transistor 212 and the fourth isolation transistor 210 are arranged in sequence.

(4) The eighth area 308, the sixth area 306, the first area 301, the third area 303, the second area 302, the seventh area 307 and the ninth area 309 are arranged in sequence.

In the eighth area 308, the third isolation transistor 209, the third offset compensation transistor 211 and the equalizing transistor 213 are arranged in sequence;

in the third area 303, the first isolation transistor 207, the first offset compensation transistor 203, the second offset compensation transistor 204 and the second isolation transistor 208 are arranged in sequence; and in the ninth area 309, the fourth isolation transistor 210 and the fourth offset compensation transistor 212 are arranged in sequence.

Or, in the eighth area 308, the third offset compensation transistor 211 and the third isolation transistor 209 are arranged in sequence;

in the third area 303, the equalizing transistor 213, the first isolation transistor 207, the first offset compensation transistor 203, the second offset compensation transistor 204 and the second isolation transistor 208 are arranged in sequence; and in the ninth area 309, the fourth isolation transistor 210 and the fourth offset compensation transistor 212 are arranged in sequence.

(5) The eighth area 308, the sixth area 306, the first area 301, the third area 303, the second area 302, the seventh area 307 and the ninth area 309 are arranged in sequence.

In the eighth area 308, the third offset compensation transistor 211, the third isolation transistor 209 and the equalizing transistor 213 are arranged in sequence;

in the third area 303, the first isolation transistor 207, the first offset compensation transistor 203, the second offset compensation transistor 204 and the second isolation transistor 208 are arranged in sequence; and in the ninth area 309, the fourth isolation transistor 210 and the fourth offset compensation transistor 212 are arranged in sequence.

Or, in the eighth area 308, the third offset compensation transistor 211 and the third isolation transistor 209 are arranged in sequence;

in the third area 303, the equalizing transistor 213, the first isolation transistor 207, the first offset compensation transistor 203, the second offset compensation transistor 204 and the second isolation transistor 208 are arranged in sequence; and in the ninth area 309, the fourth isolation transistor 210 and the fourth offset compensation transistor 212 are arranged in sequence.

(6) The ninth area 309, the sixth area 306, the first area 301, the third area 303, the second area 302, the seventh area 307 and the eighth area 308 are arranged in sequence.

In the ninth area 309, the fourth isolation transistor 210 and the fourth offset compensation transistor 212 are arranged in sequence;

in the third area 303, the equalizing transistor 213, the first isolation transistor 207, the first offset compensation transistor 203, the second offset compensation transistor 204 and the second isolation transistor 208 are arranged in sequence; and in the eighth area 308, the third offset compensation transistor 211 and the third isolation transistor 209 are arranged in sequence.

(7) The ninth area 309, the first area 301, the sixth area 306, the third area 303, the seventh area 307 and the eighth area 308 are arranged in sequence.

In the ninth area 309, the fourth isolation transistor 210, the fourth offset compensation transistor 212 and the equalizing transistor 213 are arranged in sequence;

in the third area 303, the first isolation transistor 207, the first offset compensation transistor 203, the second offset compensation transistor 204 and the second isolation transistor 208 are arranged in sequence; and in the eighth area 308, the third offset compensation transistor 211 and the third isolation transistor 209 are arranged in sequence.

Or, in the ninth area 309, the fourth isolation transistor 210 and the fourth offset compensation transistor 212 are arranged in sequence;

in the third area 303, the equalizing transistor 213, the first isolation transistor 207, the first offset compensation transistor 203, the second offset compensation transistor 204 and the second isolation transistor 208 are arranged in sequence; and in the eighth area 308, the third offset compensation transistor 211 and the third isolation transistor 209 are arranged in sequence.

(8) The eighth area 308, the first area 301, the sixth area 306, the third area 303, the seventh area 307 and the ninth area 309 are arranged in sequence.

In the eighth area 308, the third offset compensation transistor 211 and the third isolation transistor 209 are arranged in sequence;

in the third area 303, the equalizing transistor 213, the first isolation transistor 207, the first offset compensation transistor 203, the second offset compensation transistor 204 and the second isolation transistor 208 are arranged in sequence; and in the ninth area 309, the fourth isolation transistor 210 and the fourth offset compensation transistor 212 are arranged in sequence.

In the above arrangement, each of the third area 303, the fourth area 304, the fifth area 305, the eighth area 308 and the ninth area 309 includes an active area, and the transistors included in each area share the same active area.

For multiple groups of amplification circuits arranged in the second direction X, the active areas where one terminals (the sources or the drains), for connecting to the preset voltage, of the first offset compensation transistor 203 and the second offset compensation transistor 204 are located are interconnected, and the active areas where the other terminals are located are not interconnected.

For multiple groups of amplification circuits arranged in the second direction X, the gates of the third offset compensation transistor 211, the third isolation transistor 209, the equalizing transistor 213, the first isolation transistor 207, the first offset compensation transistor 203, the second offset compensation transistor 204, the second isolation transistor 208, the fourth isolation transistor 210 and the fourth offset compensation transistor 212 all extend in the first direction Y and cover the multiple active areas to form the gates of the corresponding transistors in each group of amplification circuits.

It should be understood that the readout circuit architecture provided by the embodiments of the disclosure includes a variety of transistor layout designs, which can adapt to a variety of design requirements and help determine the optimal layout design, thereby shortening the wiring length, improving the level of integration, and improving the overall performance.

Figure 10:
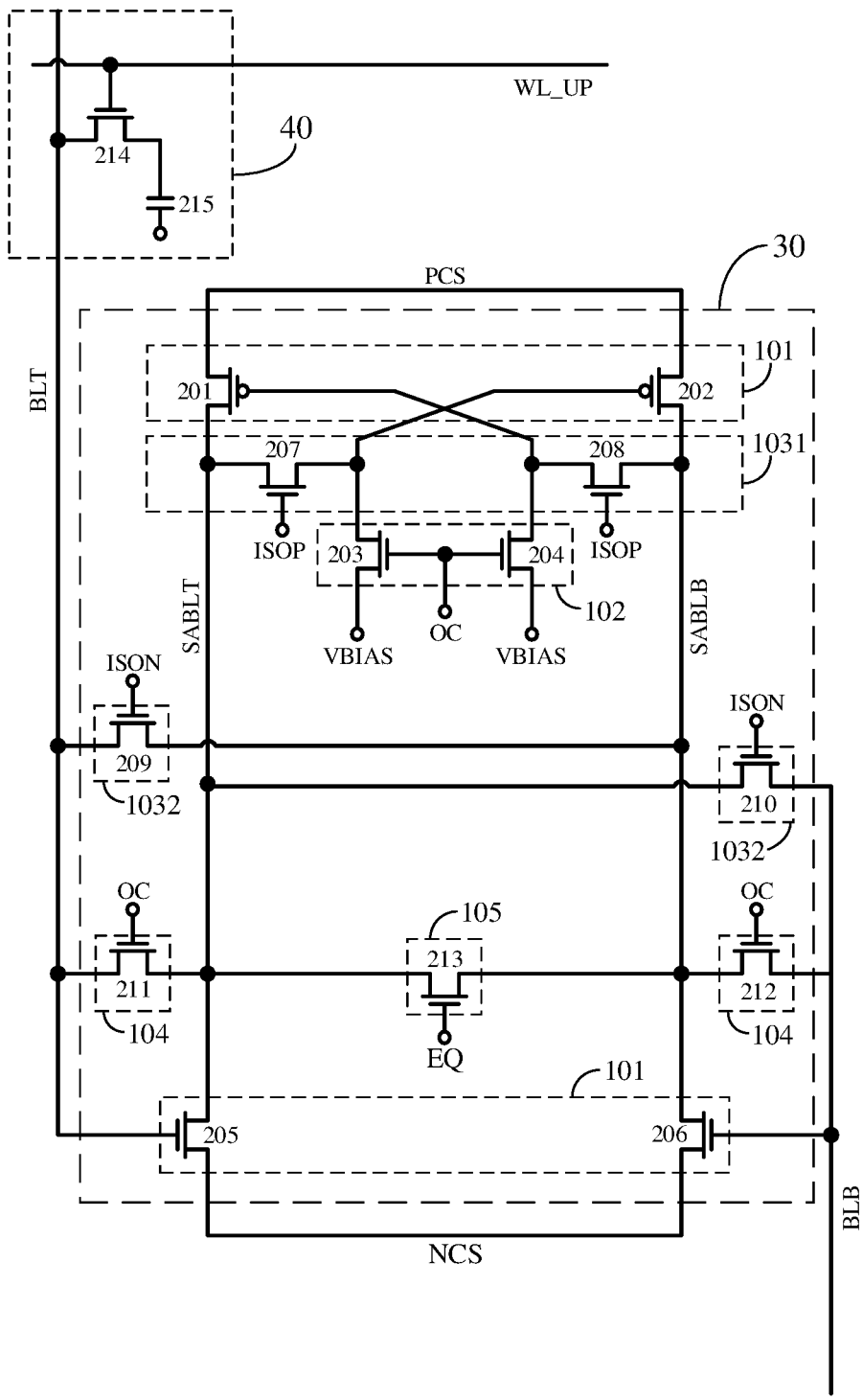
FIG. 10 is a structure diagram of a sense amplification circuit provided by an embodiment of the disclosure.

FIG. 10 is a structure diagram of a sense amplification circuit provided by an embodiment of the disclosure. In combination with FIG. 1 and FIG. 10, the sense amplification circuit 30 includes a readout amplification unit 101, a first offset compensation unit 102, an isolation unit 103 and a second offset compensation unit 104.

The readout amplification unit 101 is configured to amplify a target voltage on a readout bit line SABLT and a complementary readout bit line SABLB. The readout amplification unit 101 includes a P-type transistor and an N-type transistor.

The isolation unit 103 is configured to connect a bit line BLT to the complementary readout bit line SABLB and connect a complementary bit line BLB to the readout bit line SABLT in response to an isolation signal ISON, and connect a control terminal of the P-type transistor to the readout bit line SABLT or the complementary readout bit line SABLB in response to an isolation signal ISOP.

The first offset compensation unit 102 is configured to connect the control terminal of the P-type transistor to a preset voltage VBIAS in response to an offset cancelling OC signal.

The second offset compensation unit 104 is configured to connect the bit line BLT to the readout bit line SABLT and connect the complementary bit line BLB to the complementary readout bit line SABLB in response to the offset cancelling OC signal.

In some embodiments of the disclosure, the isolation unit 103 includes a first isolation subunit 1031 and a second isolation subunit 1032. The isolation signal includes: a first isolation signal ISOP and a second isolation signal ISON. The first isolation subunit 1031 is configured to connect the control terminal of the P-type transistor to the readout bit line SABLT or the complementary readout bit line SABLB in response to the first isolation signal ISOP. The second isolation subunit 1032 is configured to connect the bit line BLT to the complementary readout bit line SABLB and connect the complementary bit line BLB to the readout bit line SABLT in response to the second isolation signal ISON.

In some embodiments of the disclosure, the P-type transistor includes a first P-type transistor 201 and a second P-type transistor 202. The N-type transistor includes a first N-type transistor 205 and a second N-type transistor 206. A first terminal of the first P-type transistor 201 is connected to the readout bit line SABLT, and a second terminal of the first P-type transistor 201 is connected to a first voltage PCS. A first terminal of the second P-type transistor 202 is connected to the complementary readout bit line SABLB, and a second terminal of the second P-type transistor 202 is connected to the first voltage PCS. A control terminal of the first N-type transistor 205 is connected to the bit line BLT, a first terminal of the first N-type transistor 205 is connected to the readout bit line SABLT, and a second terminal of the first N-type transistor 205 is connected to a second voltage NCS. A control terminal of the second N-type transistor 206 is connected to the complementary bit line BLB, a first terminal of the second N-type transistor 206 is connected to the complementary readout bit line SABLB, and a second terminal of the second N-type transistor 206 is connected to the second voltage NCS.

In some embodiments of the disclosure, the first isolation subunit 1031 includes a first isolation transistor 207 and a second isolation transistor 208. Both a control terminal of the first isolation transistor 207 and a control terminal of the second isolation transistor 208 are configured to receive the first isolation signal ISOP. A first terminal of the first isolation transistor 207 is connected to a control terminal of the second P-type transistor 202, and a second terminal of the first isolation transistor 207 is connected to the readout bit line SABLT. A first terminal of the second isolation transistor 208 is connected to a control terminal of the first P-type transistor 201, and a second terminal of the second isolation transistor 208 is connected to the complementary readout bit line SABLB.

In some embodiments of the disclosure, the second isolation subunit 1032 includes a third isolation transistor 209 and a fourth isolation transistor 210. Both a control terminal of the third isolation transistor 209 and a control terminal of the fourth isolation transistor 210 are configured to receive the second isolation signal ISON. A first terminal of the third isolation transistor 209 is connected to the bit line BLT, and a second terminal of the third isolation transistor 209 is connected to the complementary readout bit line SABLB. A first terminal of the fourth isolation transistor 210 is connected to the complementary bit line BLB, and a second terminal of the fourth isolation transistor 210 is connected to the readout bit line SABLT.

In some embodiments of the disclosure, the first offset compensation unit 102 includes a first offset compensation transistor 203 and a second offset compensation transistor 204. Both a control terminal of the first offset compensation transistor 203 and a control terminal of the second offset compensation transistor 204 are configured to receive the offset cancelling OC signal. Both a first terminal of the first offset compensation transistor 203 and a first terminal of the second offset compensation transistor 204 are connected to the preset voltage VBIAS. A second terminal of the first offset compensation transistor 203 is connected to the control terminal of the second P-type transistor 202, and a second terminal of the second offset compensation transistor 204 is connected to the control terminal of the first P-type transistor 201.

In some embodiments of the disclosure, the second offset compensation unit 104 includes a third offset compensation transistor 211 and a fourth offset compensation transistor 212. Both a control terminal of the third offset compensation transistor 211 and a control terminal of the fourth offset compensation transistor 212 are configured to receive the offset cancelling OC signal. A first terminal of the third offset compensation transistor 211 is connected to the bit line BLT, and a second terminal of the third offset compensation transistor 211 is connected to the readout bit line SABLT. A first terminal of the fourth offset compensation transistor 212 is connected to the complementary bit line BLB, and a second terminal of the fourth offset compensation transistor 212 is connected to the complementary readout bit line SABLB.

In some embodiments of the disclosure, the sense amplification circuit 30 further includes an equalizing unit 105, which is configured to equalize voltages of the readout bit line SABLT and the complementary readout bit line SABLB in response to an equalizing signal EQ. The equalizing unit 105 includes an equalizing transistor 213. A control terminal of the equalizing transistor 213 is configured to receive the equalizing signal EQ, a first terminal of the equalizing transistor 213 is connected to the readout bit line SABLT, and a second terminal of the equalizing transistor 213 is connected to the complementary readout bit line SABLB.

Figure 11:
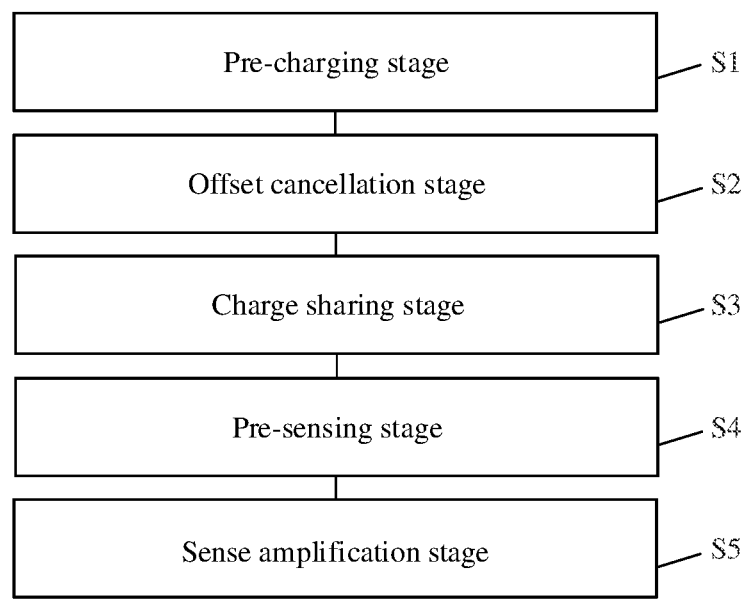
FIG. 11 is a first flowchart of a sense amplification circuit provided by an embodiment of the disclosure.
Figure 12:
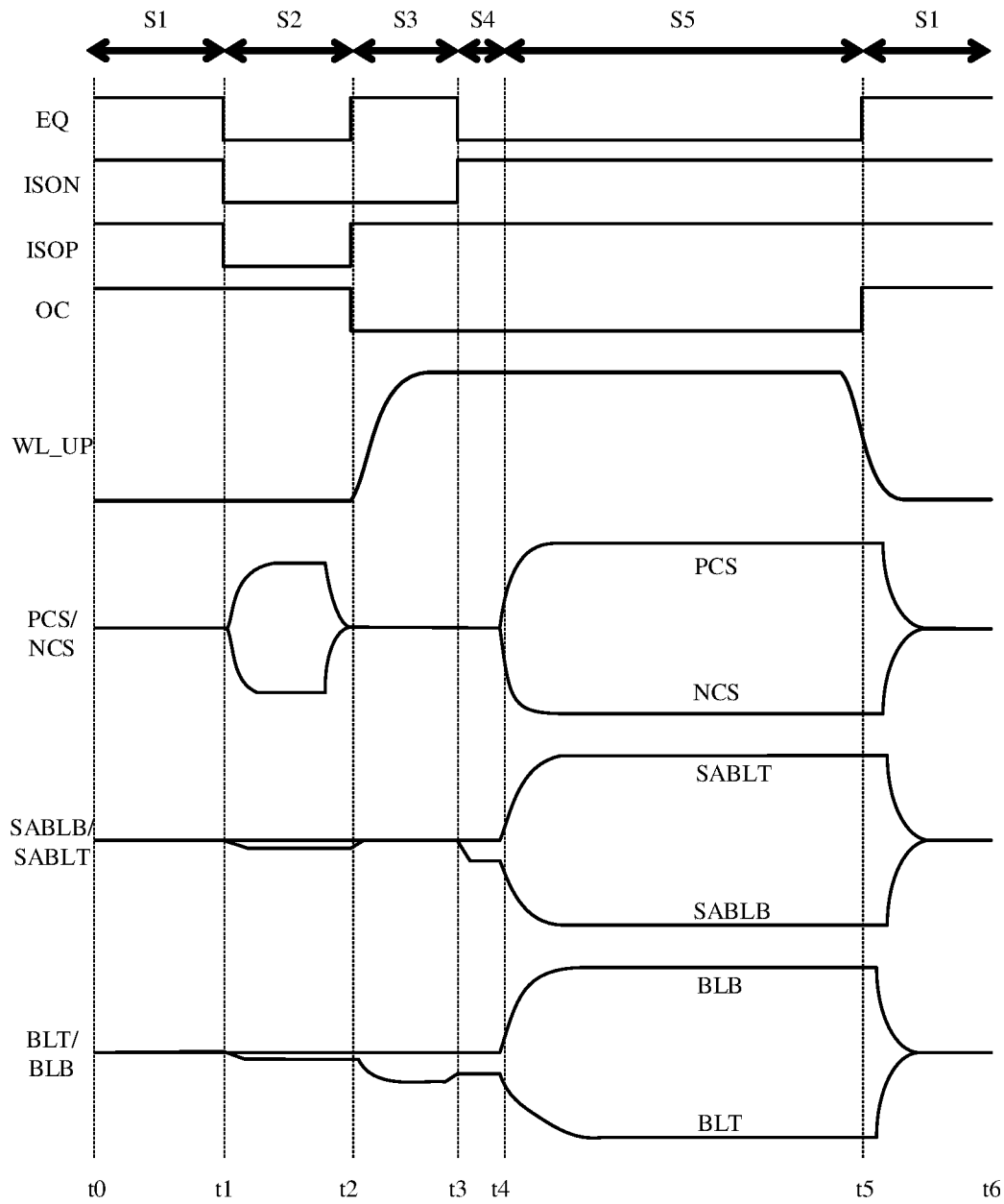
FIG. 12 is a second flowchart of a sense amplification circuit provided by an embodiment of the disclosure.

In the embodiments of the disclosure, a memory cell 40 stores data, where the data is stored in the form of electrical charge in a capacitor 215. The sense amplification circuit 30 is configured to read out and write back the data stored in the memory cell 40, which includes the following processes in combination with FIG. 10, FIG. 11 and FIG. 12.

S1, a Pre-Charging Stage.

The first isolation signal ISOP, the second isolation signal ISON, the offset cancelling OC signal and the equalizing signal EQ are provided, and the first offset compensation transistor 203, the second offset compensation transistor 204, the first isolation transistor 207, the second isolation transistor 208, the third isolation transistor 209, the fourth isolation transistor 210, the third offset compensation transistor 211, the fourth offset compensation transistor 212 and the equalizing transistor 213 are all in a turn-on state/a conducting state, so that the bit line BLT, the readout bit line SABLT, the complementary bit line BLB and the complementary readout bit line SABLB are pre-charged to the preset voltage VBAIS. The first voltage PCS and the second voltage NCS are pre-charged to the preset voltage VBAIS through an external power supply.

S2, Offset Cancellation Stage.

The offset cancelling signal is maintained, the first voltage PCS as a first threshold voltage and the second voltage NCS as a second threshold voltage are provided to two terminals of the readout amplification unit 101, and the first offset compensation transistor 203, the second offset compensation transistor 204, the third offset compensation transistor 211 and the fourth offset compensation transistor 212 are in a turn-on state/a conducting state, so that the bit line BLT is connected to the readout bit line SABLT, the complementary bit line BLB is connected to the complementary readout bit line SABLB, and the control terminals of the P-type transistors 201 and 202 are connected to the preset voltage VBAIS.

The first threshold voltage is greater than the preset voltage VBAIS, and the preset voltage VBAIS is greater than the second threshold voltage. The voltage value of the preset voltage VBAIS is usually half of the first threshold voltage.

Exemplarily, the second threshold voltage may be a ground voltage 0V, and the first threshold voltage may be 1V.

During the offset cancellation, the first offset compensation transistor 203 and the second offset compensation transistor 204 are turned on to provide the preset voltage VBAIS to the gate of the first P-type transistor 201 and the gate of the second P-type transistor 202, and the first P-type transistor 201 and the second P-type transistor 202 are turned on based on the preset voltage VBAIS, so that the first voltage PCS is transmitted to the complementary readout bit line SABLB and the readout bit line SABLT. A device difference between the first P-type transistor 201 and the second P-type transistor 202 results in a voltage difference between the complementary readout bit line SABLB and the readout bit line SABLT, and then a threshold voltage difference between the first P-type transistor 201 and the second P-type transistor 202 is compensated through the voltage difference between the complementary readout bit line SABLB and the readout bit line SABLT, so as to realize the offset cancellation of the PMOS transistors.

The third offset compensation transistor 211 and the fourth offset compensation transistor 212 are turned on, so that the bit line BLT and the readout bit line SABLT are electrically connected and share a voltage, and the complementary bit line BLB and the complementary readout bit line SABLB are electrically connected and share a voltage. The voltage of the bit line BLT is used as the gate voltage of the first N-type transistor 205 to turn on the first N-type transistor 205, so that the second voltage NCS is electrically connected to the readout bit line SABLT, and the second voltage NCS is transmitted to the readout bit line SABLT; and the voltage of the complementary readout bit line SABLB is used as the gate voltage of the second N-type transistor 206 to turn on the second N-type transistor 206, so that the second voltage NCS is electrically connected to the complementary readout bit line SABLB, and the second voltage NCS is transmitted to the complementary readout bit line SABLB. Similarly, a threshold voltage difference between the first N-type transistor 205 and the second N-type transistor 206 is compensated through the voltage difference between the complementary readout bit line SABLB and the readout bit line SABLT, so as to realize the offset cancellation of the N-type transistors. Since the bit line BLT is electrically connected to and shares the voltage with the readout bit line SABLT, and the complementary bit line BLB is electrically connected to and shares the voltage with the complementary readout bit line SABLB, there is also a voltage difference between the bit line BLT and the complementary bit line BLB, and the threshold voltage differences between the first P-type transistor 201 and the second P-type transistor 202 and between the first N-type transistor 205 and the second N-type transistor 206 can also be compensated through the voltage difference between the bit line BLT and the complementary bit line BLB.

By turning on the P-type transistors based on the stable preset voltage VBAIS to cancel the threshold voltage differences between the P-type transistors and between the N-type transistors, thereby stably canceling the offset noise in the sense amplifier to avoid the signal sensing error in the amplification process.

S3, a Charge Sharing Stage.

A transistor 214 in the memory cell is turned on by a control instruction to turn on the memory cell 40, and the bit line BLT is connected to the memory cell 40, so that the memory cell 40 and the bit line BLT share the electrical charges to form the target voltage. Moreover, the voltage equalizing of the readout bit line SABLT and the complementary readout bit line SABLB is performed, where the equalizing signal EQ is provided; and the first signal terminal PCS and the second signal terminal NCS are maintained at the preset voltage VBAIS, and the readout bit line SABLT and the complementary readout bit line SABLB are maintained at the preset voltage VBAIS.

After the memory cell 40 and the bit line BLT share the electrical charges, the voltage on the bit line BLT will be decreased or increased depending on the data stored in the memory cell 40. If the stored data is "0", the voltage on the bit line BLT will be decreased, forming the target voltage lower than the preset voltage VBAIS. If the stored data is "1", the voltage on the bit line BLT will be increased, forming the target voltage higher than the preset voltage VBAIS.

S4, a Pre-Sensing Stage.

In the pre-sensing stage, the first signal terminal PCS and the second signal terminal NCS are maintained at the preset voltage VBAIS, and the first isolation signal ISOP and the second isolation signal ISON are provided, so that the bit line BLT is connected to the complementary readout bit line SABLB, and the complementary bit line BLB is connected to the readout bit line SABLT. In such way, the bit line BLT is connected to the complementary readout bit line SABLB, and the target voltage is transmitted to the complementary readout bit line SABLB.

S5, a Sense Amplification Stage.

In the sense amplification stage, the first voltage PCS as the first threshold voltage and the second voltage NCS as the second threshold voltage are provided to the two terminals of the readout amplification unit 101 to pull down or pull up the voltage of the complementary readout bit line SABLB, so that the voltage on the bit line BLT is further decreased or increased, and the data in the memory cell is read out and amplified. Moreover, the change in the bit line BLT level will cause the synchronous change in the voltage of the memory cell 40, so as to write back data to the turned-on memory cell 40 and restore storage charges in the capacitor 215.

In the sense amplification stage, if the stored data is "0", the target voltage is low, the voltage of the complementary readout bit line SABLB is decreased, the first P-type transistor 201 is turned on, so that the first voltage PCS pulls up the voltage of the readout bit line SABLT and the bit line BLT, and the second N-type transistor 206 is turned on, so that the second voltage NCS pulls down the voltage of the complementary readout bit line SABLB and the complementary bit line BLB, thereby realizing the pull-down and amplification of the target signal.

In the sense amplification stage, if the stored data is "1", the target voltage is high, the voltage of the complementary readout bit line SABLB is increased, the first N-type transistor 205 is turned on, so that the second voltage NCS pulls down the voltage of the readout bit line SABLT and the bit line BLT, and the second P-type transistor 202 is turned on, so that the first voltage PCS pulls up the voltage of the complementary readout bit line SABLB and the complementary bit line BLB, thereby realizing the pull-up and amplification of the target signal. It should be understood that in the offset cancellation stage, the first voltage PCS and the second voltage NCS are provided to the two terminals of the readout amplification unit 101, and the stable preset voltage VBIAS is provided to the gates of the P-type transistors, so as to cancel the offset of the P-type transistors, thereby avoiding the impact of the offset on readout results, and improving the accuracy of the readout results.

It is to be noted that terms "include" and "contain" or any other variant in the disclosure is intended to cover nonexclusive inclusions herein, so that a process, method, object or device including a series of elements not only includes those elements but also includes other elements which are not clearly listed or further includes elements intrinsic to the process, the method, the object or the device. Under the condition of no more limitations, an element defined by the statement "including a/an . . . " does not exclude existence of the other same elements in a process, method, object or device including the element.

The sequence numbers of the embodiments of the disclosure are adopted not to represent superiority-inferiority of the embodiments but only for description. The methods disclosed in some method embodiments provided in the disclosure may be arbitrarily combined without conflicts to obtain new method embodiments. The characteristics disclosed in some product embodiments provided in the disclosure may be arbitrarily combined without conflicts to obtain new product embodiments. The characteristics disclosed in some method or device embodiments provided in the disclosure may be arbitrarily combined without conflicts to obtain new method embodiments or device embodiments.

The above is only the specific implementation modes of the disclosure and not intended to limit the protection scope of the disclosure. Any change or replacement that those skilled in the art can think of easily in the scope of technologies disclosed by the disclosure shall fall within the protection scope of the disclosure. Therefore, the scope of protection of the disclosure shall be subject to the scope of protection of the claims.

INDUSTRIAL APPLICABILITY

On the one hand, the readout circuit architecture provided by the embodiments of the disclosure cancels an offset of the P-type transistors, thereby avoiding the impact of the offset on readout results, and improving the accuracy of the readout results. On the other hand, the embodiments of the disclosure include a variety of transistor layout designs, which adapts to a variety of design requirements, and help determine the optimal layout design, thereby shortening the wiring length, improving the level of integration, and improving the overall performance.

The invention claimed is:

1. A readout circuit layout, comprising a sense amplifier, the sense amplifier comprising:
 a readout amplification circuit, configured to amplify a target voltage on a readout bit line and a complementary readout bit line, the readout amplification circuit comprising a first P-type transistor and a second P-type transistor; and
 a first offset compensation circuit, configured to connect a control terminal of the first P-type transistor and a control terminal of the second P-type transistor to a preset voltage in response to an offset cancelling signal, the first offset compensation circuit comprising a first offset compensation transistor and a second offset compensation transistor;
 wherein the first P-type transistor is arranged in a first area, and the second P-type transistor is arranged in a second area;
 when the first area and the second area are arranged at interval in a first direction, both the first offset compensation transistor and the second offset compensation transistor are arranged in a third area which is located between the first area and the second area;
 when the first area and the second area are arranged adjacently in the first direction, the first offset compensation transistor is arranged in a fourth area which is arranged on a side, away from the second area, of the first area, and the second offset compensation transistor is arranged in a fifth area which is arranged on a side, away from the first area, of the second area; and,
 wherein the readout amplification circuit further comprises a first N-type transistor and a second N-type transistor;
 the first N-type transistor is arranged in a sixth area, the second N-type transistor is arranged in a seventh area, and the sixth area and the seventh area are arranged in the first direction;
 the sixth area is adjacent to the first area, the seventh area is adjacent to the second area, and both the sixth area and the seventh area are located between or outside the first area and the second area;
 when the first area and the second area are arranged at interval in the first direction, the sixth area, the first area, the third area, the second area and the seventh area are arranged in sequence in the first direction; or, the first area, the sixth area, the third area, the seventh area and the second area are arranged in sequence in the first direction; and
 when the first area and the second area are arranged adjacently in the first direction, the sixth area is located between the first area and the fourth area, and the seventh area is located between the second area and the fifth area.

2. The readout circuit layout of claim 1, wherein the sense amplifier further comprises:
 an isolation circuit, configured to: in response to an isolation signal, connect a bit line to the complementary readout bit line and connect a complementary bit line to the readout bit line, and connect the control terminal of the first P-type transistor to the complementary readout bit line and connect the control terminal of the second P-type transistor to the readout bit line, the isolation circuit comprising a first isolation transistor, a second isolation transistor, a third isolation transistor and a fourth isolation transistor; and
 a second offset compensation circuit, configured to connect the bit line to the readout bit line and connect the complementary bit line to the complementary readout bit line in response to the offset cancelling signal, the second offset compensation circuit comprising a third offset compensation transistor and a fourth offset compensation transistor;
 wherein both the third isolation transistor and the third offset compensation transistor are arranged in an eighth area, both the fourth isolation transistor and the fourth offset compensation transistor are arranged in a ninth area, and the eighth area and the ninth area are arranged outside the first area and the second area in the first direction and are located on different sides of the first area and the second area;
 when the first area and the second area are arranged at interval in the first direction, both the first isolation transistor and the second isolation transistor are arranged in the third area;

when the first area and the second area are arranged adjacently in the first direction, the first isolation transistor is arranged in the fourth area, and the second isolation transistor is arranged in the fifth area.

3. The readout circuit layout of claim 2, wherein the sense amplifier further comprises:
an equalizing circuit, configured to equalize voltages of the readout bit line and the complementary readout bit line, the equalizing circuit comprising an equalizing transistor;
wherein the equalizing transistor is arranged in one of the third area, the fourth area, the fifth area, the eighth area and the ninth area.

4. The readout circuit layout of claim 2, wherein both the first isolation transistor and the second isolation transistor are arranged in the third area, which comprises: the first isolation transistor, the first offset compensation transistor, the second offset compensation transistor and the second isolation transistor are arranged in sequential order in the first direction, or, the first offset compensation transistor, the first isolation transistor, the second isolation transistor and the second offset compensation transistor are arranged in sequential order in the first direction;
wherein the first isolation transistor, the first offset compensation transistor, the second offset compensation transistor and the second isolation transistor share the same active area.

5. The readout circuit layout of claim 2, wherein, in the fourth area, the first offset compensation transistor and the first isolation transistor are arranged in sequential order or in reverse order in the first direction, and the first offset compensation transistor and the first isolation transistor share the same active area extending in the first direction; and
in the fifth area, the second isolation transistor and the second offset compensation transistor are arranged in sequential order or in reverse order in the first direction, and the second isolation transistor and the second offset compensation transistor share the same active area.

6. The readout circuit layout of claim 2, wherein, in the eighth area, the third offset compensation transistor and the third isolation transistor are arranged in sequential order or in reverse order in the first direction, and the third offset compensation transistor and the third isolation transistor share the same active area; and
in the ninth area, the fourth isolation transistor and the fourth offset compensation transistor are arranged in sequential order or in reverse order in the first direction, and the fourth isolation transistor and the fourth offset compensation transistor share the same active area.

7. The readout circuit layout of claim 2, wherein the fourth area is connected to the eighth area, and the fifth area is connected to the ninth area;
in the fourth area and the eighth area which are connected, the first offset compensation transistor, the first isolation transistor, the third offset compensation transistor and the third isolation transistor are arranged in sequential order or in reverse order in the first direction; and the first offset compensation transistor, the first isolation transistor, the third offset compensation transistor and the third isolation transistor share the same active area; and
in the fifth area and the ninth area which are connected, the fourth isolation transistor, the fourth offset compensation transistor, the second isolation transistor and the second offset compensation transistor are arranged in sequential order or in reverse order in the first direction;
and the fourth isolation transistor, the fourth offset compensation transistor, the second isolation transistor and the second offset compensation transistor share the same active area.

8. The readout circuit layout of claim 1, wherein there are a plurality of groups of sense amplifiers, the plurality of groups of sense amplifiers are arranged separately in a second direction, and the second direction is perpendicular to the first direction;
the first P-type transistors of two adjacent groups of sense amplifiers share the same first active area, the first active area is arranged in the first area, and the first area further comprises two first P-type transistor gates arranged above the first active area and arranged in the second direction;
the second P-type transistors of the two adjacent groups of sense amplifiers share the same second active area, the second active area is arranged in the second area, and the second area further comprises two second P-type transistor gates arranged above the second active area and arranged in the second direction;
the first offset compensation transistors of the plurality of groups of sense amplifiers correspond to a plurality of third active areas, the plurality of third active areas are arranged separately in the second direction, the plurality of third active areas are arranged in the third area or the fourth area, the third area or the fourth area further comprises one first offset compensation transistor gate extending in the second direction, and the one first offset compensation transistor gate covers the plurality third active areas; and
the second offset compensation transistors of the plurality of groups of sense amplifiers correspond to a plurality of fourth active areas, the plurality of fourth active areas are arranged separately in the second direction, the plurality of fourth active areas are arranged in the third area or the fifth area, the third area or the fifth area further comprises one second offset compensation transistor gate extending in the second direction, and the one second offset compensation transistor gate covers the plurality of fourth active areas.

9. The readout circuit layout of claim 8, wherein the plurality of third active areas where sources or drains of the first offset compensation transistors of the plurality of groups of sense amplifiers are located are interconnected; and
the plurality of fourth active areas where sources or drains of the second offset compensation transistors of the plurality of groups of sense amplifiers are located are interconnected.

10. A sense amplification circuit, comprising:
a readout amplification circuit, configured to amplify a target voltage on a readout bit line and a complementary readout bit line, the readout amplification circuit comprising a P-type transistor and an N-type transistor;
an isolation circuit, configured to connect a bit line to the complementary readout bit line and connect a complementary bit line to the readout bit line in response to an isolation signal, and connect a control terminal of the P-type transistor to the readout bit line or the complementary readout bit line in response to the isolation signal;

a first offset compensation circuit, configured to connect the control terminal of the P-type transistor to a preset voltage in response to an offset cancelling signal; and a second offset compensation circuit, configured to connect the bit line to the readout bit line and connect the complementary bit line to the complementary readout bit line in response to the offset cancelling signal; and, wherein the isolation circuit comprises a first isolation sub-circuit and a second isolation sub-circuit, and the isolation signal comprises a first isolation signal and a second isolation signal;

the first isolation sub-circuit is configured to connect the control terminal of the P-type transistor to the readout bit line or the complementary readout bit line in response to the first isolation signal;

the second isolation sub-circuit is configured to connect the bit line to the complementary readout bit line and connect the complementary bit line to the readout bit line in response to the second isolation signal;

wherein the second isolation sub-circuit comprises a third isolation transistor and a fourth isolation transistor; and both a control terminal of the third isolation transistor and a control terminal of the fourth isolation transistor are configured to receive the second isolation signal; a first terminal of the third isolation transistor is connected to the bit line, and a second terminal of the third isolation transistor is connected to the complementary readout bit line; and a first terminal of the fourth isolation transistor is connected to the complementary bit line, and a second terminal of the fourth isolation transistor is connected to the readout bit line.

11. The sense amplification circuit of claim 10, wherein the P-type transistor comprises a first P-type transistor and a second P-type transistor, and the N-type transistor comprises a first N-type transistor and a second N-type transistor;

a first terminal of the first P-type transistor is connected to the readout bit line, and a second terminal is connected to a first voltage; a first terminal of the second P-type transistor is connected to the complementary readout bit line, and a second terminal is connected to the first voltage; a control terminal of the first N-type transistor is connected to the bit line, a first terminal of the first N-type transistor is connected to the readout bit line, and a second terminal of the first N-type transistor is connected to a second voltage; and a control terminal of the second N-type transistor is connected to the complementary bit line, a first terminal of the second N-type transistor is connected to the complementary readout bit line, and a second terminal of the second N-type transistor is connected to the second voltage.

12. The sense amplification circuit of claim 11, wherein the first isolation sub-circuit comprises a first isolation transistor and a second isolation transistor;

both a control terminal of the first isolation transistor and a control terminal of the second isolation transistor are configured to receive the first isolation signal; a first terminal of the first isolation transistor is connected to the control terminal of the second P-type transistor, and a second terminal of the first isolation transistor is connected to the readout bit line; and a first terminal of the second isolation transistor is connected to the control terminal of the first P-type transistor, and a second terminal of the second isolation transistor is connected to the complementary readout bit line.

13. The sense amplification circuit of claim 11, wherein the first offset compensation circuit comprises a first offset compensation transistor and a second offset compensation transistor;

both a control terminal of the first offset compensation transistor and a control terminal of the second offset compensation transistor are configured to receive the offset cancelling signal; both a first terminal of the first offset compensation transistor and a first terminal of the second offset compensation transistor are connected to the preset voltage; a second terminal of the first offset compensation transistor is connected to the control terminal of the second P-type transistor; and a second terminal of the second offset compensation transistor is connected to the control terminal of the first P-type transistor.

14. The sense amplification circuit of claim 10, wherein the second offset compensation circuit comprises a third offset compensation transistor and a fourth offset compensation transistor;

both a control terminal of the third offset compensation transistor and a control terminal of the fourth offset compensation transistor are configured to receive the offset cancelling signal; a first terminal of the third offset compensation transistor is connected to the bit line, and a second terminal of the third offset compensation transistor is connected to the readout bit line; and a first terminal of the fourth offset compensation transistor is connected to the complementary bit line, and a second terminal of the fourth offset compensation transistor is connected to the complementary readout bit line.

15. The sense amplification circuit of claim 10, further comprising:

an equalizing circuit, configured to equalize voltages of the readout bit line and the complementary readout bit line;

wherein the equalizing circuit comprises an equalizing transistor; and wherein a control terminal of the equalizing transistor is configured to receive an equalizing signal, a first terminal of the equalizing transistor is connected to the readout bit line, and a second terminal of the equalizing transistor is connected to the complementary readout bit line.

* * * * *